(12) United States Patent
Park

(10) Patent No.: US 10,868,191 B2
(45) Date of Patent: Dec. 15, 2020

(54) PATTERNING ELECTRONIC DEVICES USING REACTIVE-ION ETCHING OF TIN OXIDES

(71) Applicant: Cornell University, Ithaca, NY (US)

(72) Inventor: Jisung Park, Ithaca, NY (US)

(73) Assignee: Cornell University, Ithaca, NY (US)

( * ) Notice: Subject to any disclaimer, the term of this patent is extended or adjusted under 35 U.S.C. 154(b) by 0 days.

(21) Appl. No.: 16/706,122

(22) Filed: Dec. 6, 2019

(65) Prior Publication Data

US 2020/0185609 A1 Jun. 11, 2020

Related U.S. Application Data

(60) Provisional application No. 62/776,913, filed on Dec. 7, 2018.

(51) Int. Cl.
| | |
|---|---|
| *H01L 29/786* | (2006.01) |
| *H01L 29/45* | (2006.01) |
| *H01L 29/24* | (2006.01) |
| *H01L 29/51* | (2006.01) |
| *H01L 29/49* | (2006.01) |

(Continued)

(52) U.S. Cl.
CPC .......... *H01L 29/7869* (2013.01); *C01G 19/02* (2013.01); *C04B 35/4682* (2013.01); *H01L 21/3065* (2013.01); *H01L 21/31144* (2013.01); *H01L 29/24* (2013.01); *H01L 29/45* (2013.01); *H01L 29/4966* (2013.01); *H01L 29/517* (2013.01); *H01L 51/0018* (2013.01); *C04B 2235/3293* (2013.01)

(58) Field of Classification Search
None
See application file for complete search history.

(56) References Cited

U.S. PATENT DOCUMENTS 5,843,277 A * 12/1998 Goto .................... H01L 31/1884
216/23

FOREIGN PATENT DOCUMENTS

WO 2016153172 A1 9/2016

OTHER PUBLICATIONS

Green, Andrew Joseph, et al., "β-Ga2O3 MOSFETs for Radio Frequency Operation," IEEE Electron Device Letters, vol. 38, No. 6, Jun. 2017, pp. 790-793.

(Continued)

*Primary Examiner* — Roberts P Culbert
(74) *Attorney, Agent, or Firm* — Withrow & Terranova, P.L.L.C.

(57) ABSTRACT

Patterning electronic devices using reactive-ion etching of tin oxides is provided. Reactive-ion etching facilitates patterning of tin oxides, such as barium stannate ($BaSnO_3$), at a consistent and controllable etch rate. The reactive-ion etching approach described herein facilitates photolithographic patterning of tin oxide-based semiconductors to produce electronic devices, such as thin-film transistors (TFTs). This approach further patterns a tin oxide-based semiconductor without adversely affecting its electrical properties (e.g., resistivity, electron or hole mobility), as well as maintaining surface roughness. This approach can be used to produce optically transparent devices with high drain current ($I_D$, drain-to-source current per channel width) and high on-off ratio.

22 Claims, 8 Drawing Sheets

(51) Int. Cl.
*C01G 19/02* (2006.01)
*C04B 35/468* (2006.01)
*H01L 21/3065* (2006.01)
*H01L 21/311* (2006.01)
*H01L 51/00* (2006.01)

(56) References Cited

OTHER PUBLICATIONS

Hogan, Jack E., et al., "Chlorine-based Dry Etching of β-Ga2O3," Semiconductor Science and Technology, vol. 31, No. 6, published Apr. 14, 2016, IOP Publishing Ltd., 16 pages.

Kim, Hyung Joon, et al., "High Mobility in a Stable Transparent Perovskite Oxide," Applied Physics Express, vol. 5, May 2012, 3 pages.

Kim, Useong, et al., "All-perovskite transparent high mobility field effect using epitaxial BaSnO3 and LaInO3," APL Materials, vol. 3, Feb. 2015, 7 pages.

Kim, Young Mo, et al., "High-k perovskite gate oxide BaHfO3," APL Materials, vol. 5, Jan. 2017, 6 pages.

Kim, Young Mo, et al., "High-mobility BaSnO3 thin-film transistor with HfO2 gate insulator," Applied Physics Express, vol. 9, Dec. 2015, 3 pages.

Park, Chulkwon, et al., "High mobility field effect transistor based on BaSnO3 with Al2O3 gate oxide," Applied Physics Letters, vol. 105, Nov. 2014, 4 pages.

Shah, Amit P., et al., "Inductively coupled plasma reactive-ion etching of β-Ga2O3: Comprehensive investigation of plasma chemistry and temperature," Journal of Vacuum Science & Technology, vol. 35, No. 4, American Vacuum Society, May 8, 2017, 4 pages.

Shin, Juyeon, et al., "High mobility BaSnO3 films and field effect transistors on non-perovskite MgO substrate," Applied Physics Letters, vol. 109, Dec. 2016, 5 pages.

Xia, Zhanbo, et al., "Delta Doped β-Ga2O3 Field Effect Transistors With Regrown Ohmic Contacts," IEEE Electron Device Letters, vol. 39, No. 4, Apr. 2018, pp. 568-571.

Yue, Jin, et al., "Depletion Mode MOSFET Using La-Doped BaSnO3 as a Channel Material," ACS Applied Materials & Interfaces, vol. 10, 2018, pp. 21061-21065.

Zhang, Liheng, et al., "Inductively-coupled-plasma reactive ion etching of single-crystal β-Ga2O3," Japanese Journal of Applied Physics, vol. 56, No. 3, Feb. 9, 2017, 4 pages.

* cited by examiner

PATTERNING ELECTRONIC DEVICES USING REACTIVE-ION ETCHING OF TIN OXIDES

RELATED APPLICATIONS

This application claims the benefit of provisional patent application Ser. No. 62/776,913, filed Dec. 7, 2018, the disclosure of which is hereby incorporated herein by reference in its entirety.

This application is related to concurrently filed U.S. patent application Ser. No. 16/706,126, filed on Dec. 6, 2019, entitled "MICRON SCALE TIN OXIDE-BASED SEMICONDUCTOR DEVICES," which is incorporated herein by reference in its entirety.

GOVERNMENT SUPPORT

This invention was made with government support under contract number FA9550-16-1-0192 awarded by the Air Force Office of Scientific Research and contract number HR0011-18-3-0004 awarded by The Defense Advanced Research Projects Agency (DARPA). The U.S. Government has certain rights in this invention.

FIELD OF THE DISCLOSURE

The present disclosure relates to patterning of semiconductor devices, such as field-effect transistor devices, using etching.

BACKGROUND

Transparent oxide thin-film transistors (TFTs) have been studied extensively for over a decade for applications that include displays, wearable electronics, and smart windows. Due to the relatively high mobilities of the transparent oxide semiconductors used, when scaled to small dimensions transparent oxide TFTs are expected to have high drain current ($I_D$, drain-to-source current per channel width) and low power consumption, which are important for energy-sensitive applications. Tin-based oxide systems are promising materials for transparent oxide TFTs due to the superior oxygen stability and high mobility of these materials at room temperature.

Among stannates (i.e., tin-based compounds), the transparent perovskite barium stannate ($BaSnO_3$) is attracting worldwide attention following a recent discovery that lanthanum (La)-doped barium stannate has both high mobility at room temperature and excellent oxygen stability. Mobilities as high as 320 square centimeters per volt-second ($cm^2V^{-1}s^{-1}$) and 183 $cm^2V^{-1}s^{-1}$ have been achieved in lanthanum-doped barium stannate single crystals and epitaxial thin films, respectively. The high mobility of barium stannate is attributed to its having a small effective mass originating from a large dispersion of the conduction band from the 5s orbital of tin, a high dielectric constant ($K \approx 20$) which reduces dopant scattering, and small phonon scattering.

The performance of TFTs based on tin oxides has been steadily improving in recent years, with the highest $I_D$ using barium stannate achieved being 0.021 milliamps per micron (mA/μm). This performance is limited by the large size of traditional tin oxide-based TFTs, which have channel dimensions of 100-200 microns (μm). These large devices have been patterned using metal shadow masks during growth, i.e., without photolithography. Attempts to use photolithography to define smaller devices have been plagued by the creation of oxygen vacancies in the tin oxide film, including in an undoped tin oxide buffer layer, during an ion milling process. These vacancies make the undoped tin oxide buffer layer conductive, shunt the device, and degrade performance.

SUMMARY

Patterning electronic devices using reactive-ion etching of tin oxides is provided. Reactive-ion etching facilitates patterning of tin oxides, such as barium stannate ($BaSnO_3$), at a consistent and controllable etch rate. The reactive-ion etching approach described herein facilitates photolithographic patterning of tin oxide-based semiconductors to produce electronic devices, such as thin-film transistors (TFTs). This approach further patterns a tin oxide-based semiconductor without adversely affecting its electrical properties (e.g., resistivity, electron or hole mobility), as well as maintaining surface roughness. This approach can be used to produce optically transparent devices with high drain current ($I_D$, drain-to-source current per channel width) and high on-off ratio.

An exemplary embodiment provides a method for patterning an electronic device. The method includes providing a substrate and depositing an active semiconductor layer comprising a tin oxide material over the substrate. The method further includes patterning the active semiconductor layer by: masking the active semiconductor layer; and reactive-ion etching the masked active semiconductor layer such that an electrical property of the active semiconductor layer is preserved.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
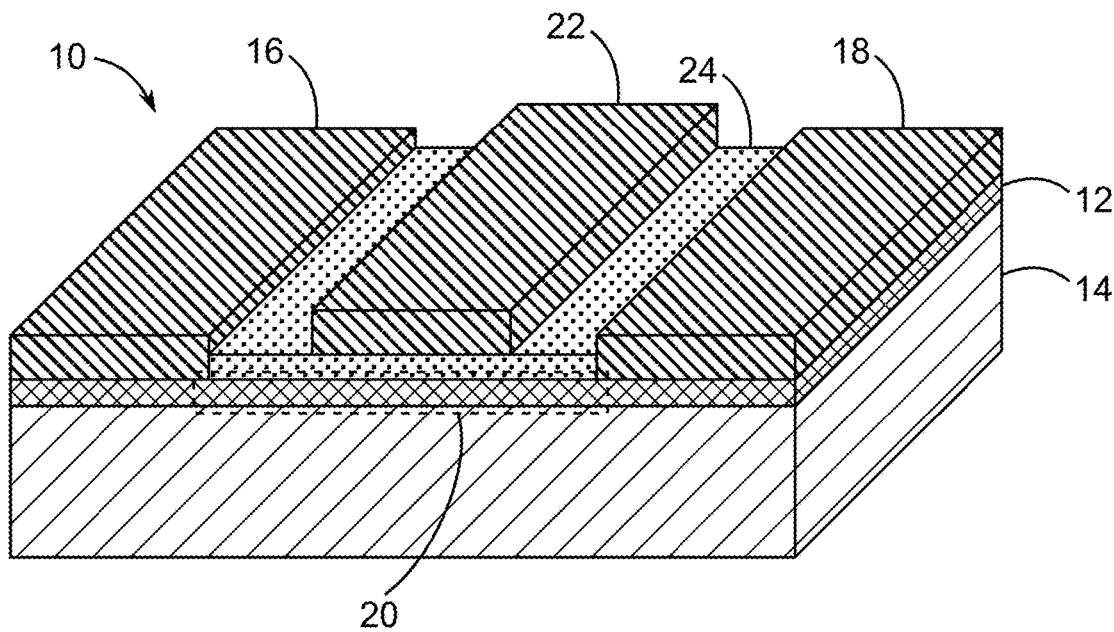
FIG. 1A is an isometric cross-sectional view of an exemplary semiconductor device having an active semiconductor layer disposed over a substrate according to embodiments disclosed herein.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Patterning electronic devices using reactive-ion etching of tin oxides is provided. Reactive-ion etching facilitates patterning of tin oxides, such as barium stannate ($BaSnO_3$), at a consistent and controllable etch rate. The reactive-ion etching approach described herein facilitates photolithographic patterning of tin oxide-based semiconductors to produce electronic devices, such as thin-film transistors (TFTs). This approach further patterns a tin oxide-based semiconductor without adversely affecting its electrical properties (e.g., resistivity, electron or hole mobility), as well as maintaining surface roughness. This approach can be used to produce optically transparent devices with high drain current ($I_D$, drain-to-source current per channel width) and high on-off ratio.

In addition, micron (μm) scale tin oxide-based semiconductor devices are provided. Reactive-ion etching is used to produce a micron-scale electronic device using semiconductor films with tin oxides, such as barium stannate. The electronic devices produced with this approach have high mobility, drain current, and on-off ratio without adversely affecting qualities of the tin oxide semiconductor, such as resistivity, electron or hole mobility, and surface roughness. In this manner, electronic devices, such as field-effect transistors (FETs) (e.g., TFTs), are produced having micron scale channel lengths and exhibiting complete depletion at room temperature.

FIG. 1A is an isometric cross-sectional view of an exemplary semiconductor device 10 having an active semiconductor layer 12 disposed over a substrate 14 according to embodiments disclosed herein. The semiconductor device 10 can be a FET (e.g., an n-doped FET (NFET) or a p-doped FET (PFET)) having a drain 16, a source 18, and a channel 20 between the drain 16 and the source 18, which is controlled by a gate 22.

The active semiconductor layer 12 is grown or otherwise deposited on the substrate 14. A dielectric layer 24 is deposited over the active semiconductor layer 12, and the gate 22 is formed over the dielectric layer 24. Applying a potential to the gate 22 causes an electric field in the channel 20 to enable or disable current flow between the drain 16 and the source 18. The active semiconductor layer 12 must be patterned to form the drain 16, source 18, channel 20, and other features of the semiconductor device 10.

In an exemplary aspect, the active semiconductor layer 12 is formed with tin oxide-based semiconductors, such as tin oxide ($SnO_x$), barium stannate, and strontium stannate ($SrSnO_3$). Such materials promise high electron or hole mobility and low power consumption. In some examples, tin oxides can be used to produce optically transparent semiconductor devices 10. However, traditional approaches to patterning tin oxides have been limited to channel dimensions of 100-200 μm due to use of metal shadow masks (rather than photolithography) during growth. Previous attempts to use photolithography using ion milling for etching the active semiconductor layer 12 to define smaller devices have resulted in creation of oxygen vacancies in the semiconductor device 10, degrading performance.

In this regard, embodiments disclosed herein pattern the active semiconductor layer 12 using reactive-ion etching to form the semiconductor device 10. This facilitates photolithographic patterning of tin oxide-based semiconductors. Patterning the semiconductor device 10 according to this approach does not adversely affect electrical properties (e.g., resistivity, electron or hole mobility) of the active semiconductor layer 12, and maintains surface roughness.

The semiconductor device 10 is illustrated as a top-gate FET. It should be understood that this is for illustrative purposes, and embodiments disclosed herein can be arranged differently, such as a bottom-gate FET (e.g., having the gate 22 and dielectric layer 24 disposed between the substrate 14 and the active semiconductor layer 12). In addition, embodiments can provide other semiconductor devices 10, such as diodes, other transistor types (e.g., bipolar junction transistors), capacitors, inductors, resistors, and so on which are patterned using the reactive-ion etching disclosed herein.

Figure 1B:
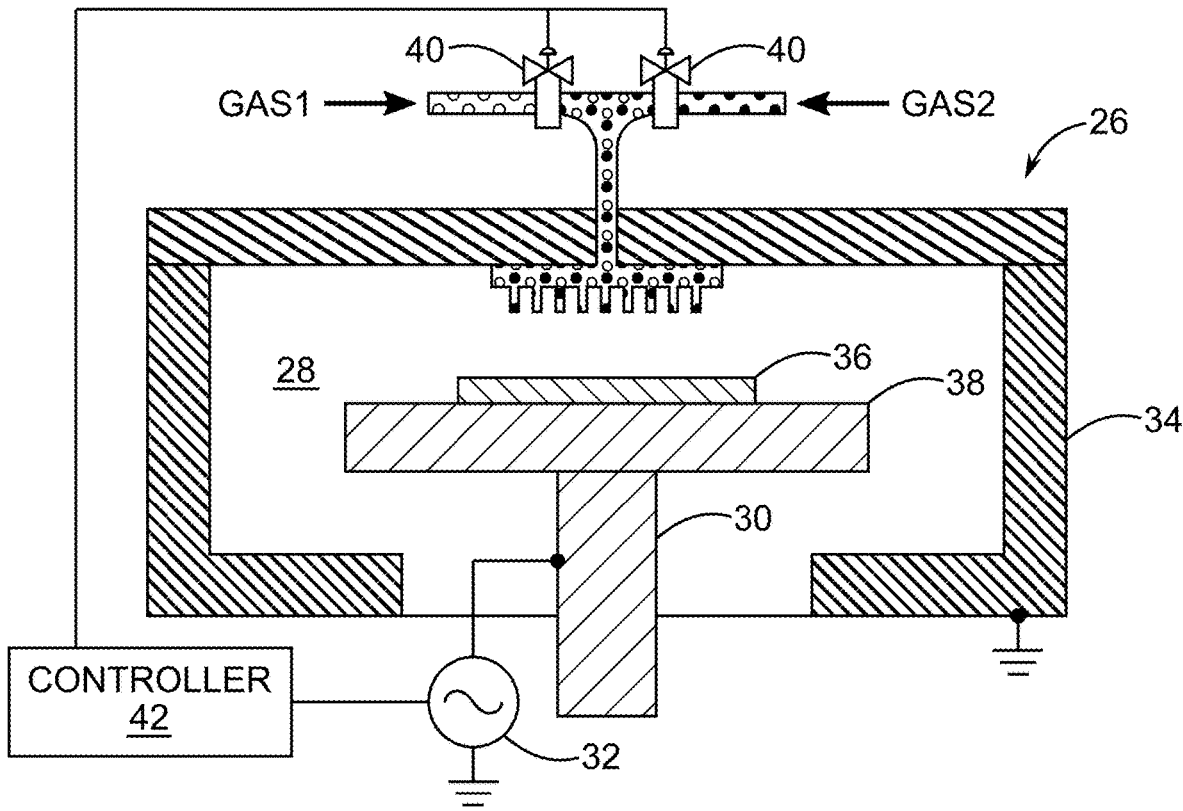
FIG. 1B is a cross-sectional view of an exemplary reactive-ion etching system for patterning the active semiconductor layer of the semiconductor device of FIG. 1A.

FIG. 1B is a cross-sectional view of an exemplary reactive-ion etching system 26 for patterning the active semiconductor layer 12 of the semiconductor device 10 of FIG. 1A. The reactive-ion etching system 26 includes a vacuum chamber 28 into which a first gas GAS1 and a second gas GAS2 are injected. An electrode 30 is energized by a current source 32, which may be a radio frequency (RF) current source operating at 13.56 megahertz (MHz) (or another frequency in the in a 10-15 MHz range as appropriate) while a wall 34 of the vacuum chamber 28 is grounded. The electrode 30 generates an electric field in the vacuum chamber 28 which ionizes the gas particles, creating a plasma. The plasma is used to etch materials placed within the vacuum chamber 28.

In order to make micron scale TFTs, it is critical to be able to lithographically pattern the active semiconductor layer 12 without degrading its electrical performance, particularly with tin oxides such as barium stannate. A few methods have been used in the past to pattern barium stannate. Early barium stannate TFTs used shadow masks to define the channel structure during deposition. This approach can pattern barium stannate without degrading its surface roughness and electrical properties, but the channel length is limited to about 100 μm. More recently, ion milling has been employed to pattern barium stannate, but the size of the channel length reported was about 100 μm. Importantly, the resulting TFT could not be depleted at room temperature and its on-off ratio was only 2. One reason for the inability to deplete the TFT at room temperature is that an undoped barium stannate buffer layer below the active semiconductor layer became conductive when subjected to ion milling due to creation of oxygen vacancies created during the ion milling process.

In order to overcome the limitations of previous techniques used to define tin oxide-based TFTs, embodiments described herein use the reactive-ion etching system 26 to photolithographically pattern semiconductor devices 10, such as TFTs. In an exemplary aspect, a tin oxide semiconductor film 36, which includes the active semiconductor layer 12 of FIG. 1A, is masked (e.g., by applying a photoresist layer) and placed on a platform 38 in the vacuum chamber 28, which may be connected to or part of the electrode 30. As discussed further below with respect to FIGS. 2A and 2B, the reactive-ion etching system 26 is operated to provide controllable etching of the tin oxide semiconductor film 36 by adjusting a power applied by the current source 32, a flow ratio of the first gas GAS1 to the second gas GAS2, and pressure. Through this etching process, the tin oxide semiconductor film 36 may be patterned to produce one or more semiconductor devices 10, such as diodes, transistors (e.g., TFTs), capacitors, inductors, resistors, and so on. In this regard, embodiments of the reactive-ion etching system 26 are controlled to preserve electrical properties (e.g., resistivity, mobility) and surface roughness (where preserving can mean no detectable change or preserving within a 5% tolerance of values before etching).

One or more flow controls 40 (e.g., controllable valves) can provide control of the flow rate of each of the first gas GAS1 and the second gas GAS2. In addition, one or more controllers 42 can control the flow controls 40 and/or control of the power applied by the current source 32. In an exemplary aspect, the tin oxide semiconductor film 36 is a barium stannate film. However, the etching process can also be applied to other tin oxides to achieve similar results.

The first gas GAS1 used in the reactive-ion etching system 26 is a reactive gas, such as chlorine ($Cl_2$), which facilitates etching the tin oxide semiconductor film 36 with a chemical process rather than a purely physical process, in contrast to ion milling. Under appropriate conditions, the conductivity issue (e.g., in an undoped buffer layer) from the creation of oxygen vacancies can be resolved. Further, a controllable etch rate is achieved that is not dependent on sample quality. This etching process for tin oxide semiconductor films 36 provides a controllable etch rate while preserving surface roughness and electrical resistivity and mobility—qualities critical to the fabrication of high-performance TFTs. In some examples, boron trichloride ($BCl_3$) or another gas can also be used for etching while preserving surface roughness and electrical properties, but the etch rate may be lower than when chlorine gas is used.

Figure 2A:
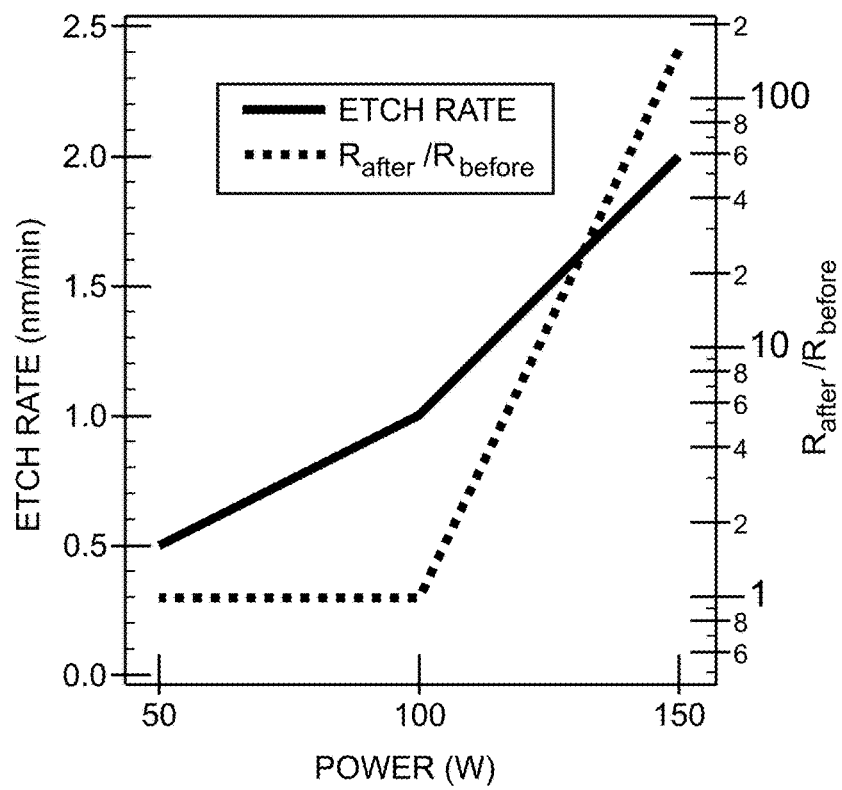
FIG. 2A is a graphical representation of an etch rate of a tin oxide semiconductor film and a ratio of resistance before and after etching, as a function of power applied to the reactive-ion etching system of FIG. 1B.

FIG. 2A is a graphical representation of an etch rate of the tin oxide semiconductor film 36 and a ratio of resistance before and after etching, as a function of power applied to the reactive-ion etching system 26 of FIG. 1B. As illustrated, the etch rate increases when the power applied by the current source 32 increases. Up to at least 100 watts (W) of power, the etch rate increases without affecting the resistivity of the tin oxide semiconductor film 36.

However, the resistivity of the tin oxide semiconductor film 36 (e.g., the resistivity of an undoped buffer layer, described further below with respect to FIG. 3) starts to decrease when the power of the power applied by the current source 32 reaches 150 W. This is due to creation of oxygen vacancies when the tin oxide semiconductor film 36 is bombarded by a high energy plasma. Decreased resistivity reduces performance of the semiconductor device 10 produced through the etching process, such as by obstructing or preventing depletion of the semiconductor device 10 at room temperature.

Accordingly, embodiments of the present disclosure control power applied by the current source 32 to produce a desired etch rate while maintaining resistivity of the tin oxide semiconductor film 36. In this regard, if the power is too low the etch rate may be undesirably low such that etching to a desired depth requires additional time. This power can safely be increased up to 100 W, achieving an etch rate of 1.3 nanometers per minute (nm/min) for barium stannate while maintaining the resistivity of the tin oxide semiconductor film 36.

Figure 2B:
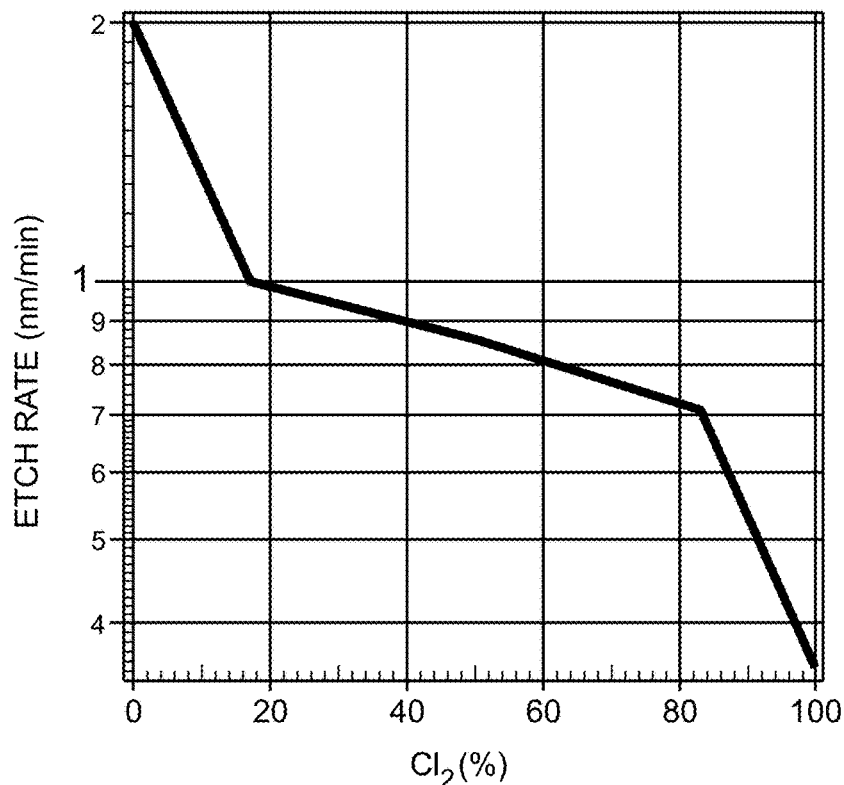
FIG. 2B is a graphical representation of an etch rate of the tin oxide-based semiconductor film of FIG. 2A as a function of gas flow rate between chlorine ($Cl_2$) and argon (Ar) gases.

FIG. 2B is a graphical representation of an etch rate of the tin oxide semiconductor film 36 of FIG. 2A as a function of gas flow rate between chlorine ($Cl_2$) and argon (Ar) gases. As described above, the etch rate of the reactive-ion etching system 26 is also controlled by adjusting a flow ratio of the first gas to the second gas. In an exemplary aspect, the first gas is chlorine and the second gas is argon. In other examples, different gases may be used for etching, such as boron trichloride ($BCl_3$) in place of chlorine.

As illustrated, the etch rate is a function of a characteristic relationship of the flow ratio of the first gas (chlorine) to the second gas (argon). That is, the etch rate decreases as the flow ratio of chlorine to argon increases, and the etch rate increases as the flow ratio of chlorine to argon decreases. However, when 100% argon is used, the resistivity of the tin oxide semiconductor film 36 decreases. This decreases performance of the semiconductor device 10 produced, as described above with respect to FIG. 2A.

Accordingly, embodiments of the present disclosure select a desired etch rate and control the flow ratio of the first gas (chlorine or boron trichloride) to the second gas (argon) to produce the desired etch rate while maintaining resistivity of the tin oxide semiconductor film 36. At a ratio of 3:1 of chlorine to argon, a tin oxide semiconductor film 36 made with barium stannate may achieve its highest etch rate without decreasing resistivity.

Embodiments of the present disclosure may achieve higher etch rates with higher flow rates of argon and lower flow rates of chlorine or boron trichloride. However, using a higher ratio of argon does not preserve the resistivity reliably because of the high-energy ion bombardment of argon ions. Thus using a higher ratio of chlorine is desired as it reliably preserves the resistivity of the etched tin oxide semiconductor film 36.

Without chlorine gas, the tin oxide semiconductor film 36 is exposed to argon gas directly and argon ion bombardment produces oxygen vacancies in the tin oxide semiconductor film 36, decreasing resistivity. Thus, chlorine gas not only etches the tin oxide semiconductor film 36, but also protects it from being exposed to argon gas directly by making chlorine-based compounds. Lower overall gas pressure and high gas flow rate can facilitate ready evaporation of these compounds (e.g., barium chloride and tin chloride). Accordingly, embodiments may use lower pressures in the vacuum chamber 28, such as 1 milliTorr (mTorr). The flow rate can be 15 standard cubic centimeters per minute (sccm) for chlorine gas and 5 sccm for argon gas, though other flow rates may be used.

Figure 3A:
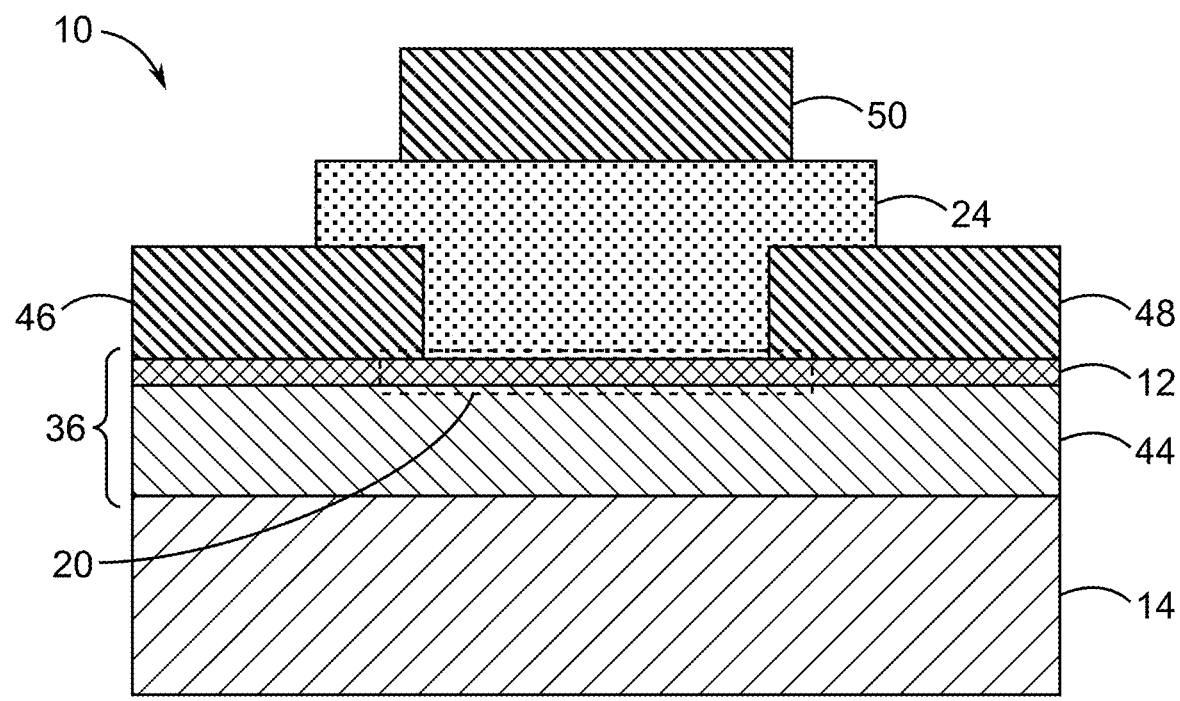
FIG. 3A is a cross-sectional view of another exemplary semiconductor device having a tin oxide semiconductor film over a substrate.

FIG. 3A is a cross-sectional view of another exemplary semiconductor device 10 having a tin oxide semiconductor film 36 over a substrate 14. The tin oxide semiconductor film 36 includes the active semiconductor layer 12, which is reactive-ion etched as described with respect to FIGS. 1A-2B.

In this regard, embodiments provide the semiconductor device 10 with the active semiconductor layer 12 etched to form the channel 20 having a channel length of less than 100 µm while preserving an electrical property of the tin oxide semiconductor film 36 (e.g., resistivity, electron or hole mobility). For example, by preserving resistivity of the tin oxide semiconductor film 36, a TFT formed according to the present disclosure can be completely isolated and depleted at room temperature.

In some examples, the tin oxide semiconductor film 36 includes a doped active semiconductor layer 12 over an undoped buffer layer 44 of the same or a similar material. The tin oxide semiconductor film 36 can be deposited over the substrate 14 using an appropriate technique, such as epitaxial growth. For example, the semiconductor device 10 can be a TFT formed with a barium stannate thin film (e.g., the tin oxide semiconductor film 36) over a magnesium oxide (MgO) substrate (e.g., the substrate 14).

After the reactive-ion etching of the active semiconductor layer 12, a source electrode 46 and a drain electrode 48 can be deposited over the active semiconductor layer 12. The source electrode 46 and drain electrode 48 can be formed with an appropriate conductive material, such as indium tin oxide (ITO, where optical transparency is desired) or a metal, such as copper (Cu), gold (Au), silver (Ag), aluminum (Al), etc. The source electrode 46 and drain electrode 48 can be deposited using an appropriate technique, such as sputtering, vapor deposition, plating, printing, etc.

In addition, the dielectric layer 24 for the gate can be deposited over the active semiconductor layer 12 and/or the source electrode 46 and drain electrode 48. The dielectric layer 24 can be an appropriate dielectric for performance of the TFT and/or transparency, such as hafnium oxide ($HfO_2$), barium hafnium oxide ($BaHfO_3$), lanthanum indium oxide ($LaInO_3$), or other inorganic or organic dielectric materials. The dielectric layer 24 can be deposited using an appropriate technique, such as atomic-layer deposition (ALD), spin on, spray on, vapor deposition, sputtering, etc. A gate electrode 50 is deposited over the dielectric layer 24, using an appropriate material (e.g., ITO) and deposition technique (e.g., sputtering), such as used for the source electrode 46 and drain electrode 48.

Figure 3B:
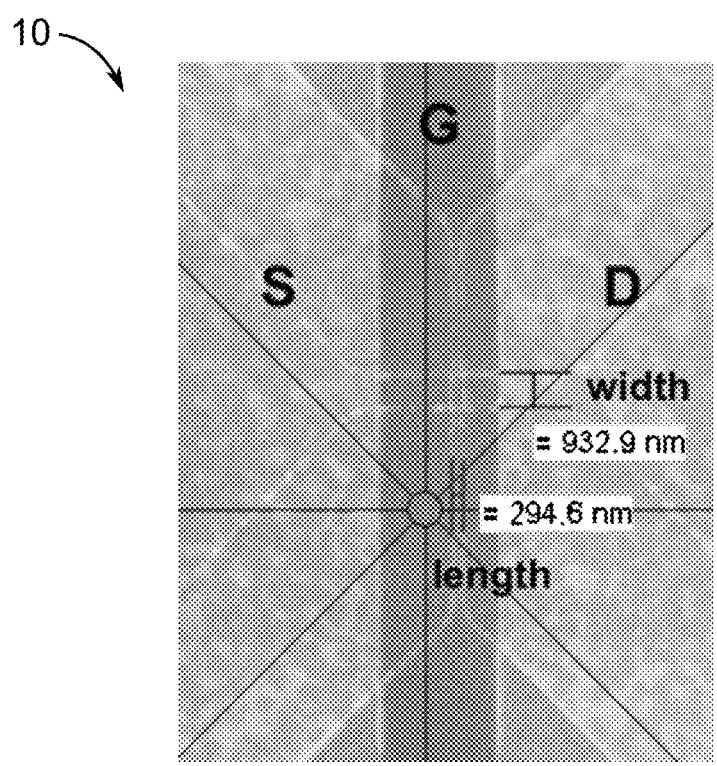
FIG. 3B is a scanning electron microscope image of an embodiment of the semiconductor device of FIG. 3A formed as a thin-film transistor (TFT) with a barium stannate thin film over a magnesium oxide substrate.

FIG. 3B is a scanning electron microscope image of an embodiment of the semiconductor device 10 of FIG. 3A formed as a TFT using a barium stannate thin film over a magnesium oxide substrate. The mobility and carrier concentration of the as-grown active semiconductor layer 12 are $\mu=65.2$ $cm^2V^{-1}s^{-1}$ and $n=1.81\times10^{19}$ $cm^{-3}$, respectively, from Hall measurements at room temperature. The channel length and width of the TFT are L=0.3 µm and W=0.93 µm, respectively. This is the smallest barium stannate-based TFT yet reported. Further scaling is limited by the resolution of the light exposing tool (e.g., an Autostep 200 stepper was used for the embodiment of FIG. 3A). As such, smaller devices may be achieved according to the etching methods described herein (e.g., by using a higher resolution light exposing tool).

With reference to FIGS. 3A and 3B, in an exemplary embodiment a barium stannate thin film (e.g., the tin oxide semiconductor film 36) is doped with lanthanum (La) (or another appropriate dopant). The barium stannate thin film is epitaxially grown on a magnesium oxide substrate (e.g., the substrate 14) by adsorption-controlled growth using molecular-beam epitaxy with barium, lanthanum, and tin oxide sources. In further detail, an undoped barium stannate buffer layer 44 is grown over the substrate 14, followed by a lanthanum-doped barium stannate active semiconductor layer 12. The channel 20 is formed using the active semiconductor layer 12. The purpose of the buffer layer 44 is to reduce the density of threading dislocations that propagate into the overlying doped (and conducting) active semiconductor layer 12. Even with such a buffer layer 44, the threading dislocation density of barium stannate films grown on magnesium oxide as well as other commonly used substrates is of order $10^{11}$ per centimeter (cm$^{-2}$); an ideal substrate for barium stannate has yet to be demonstrated, but several lattice matched candidates are being developed, such as Ba$_2$ScNbO$_6$ and (La,Nd)(Lu,Sc)O$_3$. It should be understood that the teachings of the present disclosure extend to such substrates as well.

In an exemplary aspect, the heterostructure of the tin oxide semiconductor film 36 for TFT fabrication using barium stannate includes a 100-150 nanometer (nm) thick unintentionally doped buffer layer 44 followed by approximately 10 nm (e.g., +/−5%) of doped active semiconductor layer 12. In test structures, the Hall mobility of a 10-nm-thick lanthanum-doped barium stannate active semiconductor layer 12 (grown on a magnesium oxide substrate with an undoped barium stannate buffer layer) reaches 184 square centimeters per volt-second (cm$^2$V$^{-1}$s$^{-1}$) at a carrier concentration of 6.5×10$^{19}$ per cubic centimeter (cm$^{-3}$). Despite the thin tin oxide semiconductor film 36 and the use of a magnesium oxide substrate 14, this value is the highest mobility reported for any barium stannate thin film using other substrates, such as a dysprosium scandium oxide (DyScO$_3$) substrate.

The Hall mobility of a 10 nm thick lanthanum-doped barium stannate active semiconductor layer 12 (on a 150 nm thick undoped barium stannate buffer layer 44) with a carrier concentration of 1.3×10$^{19}$ cm$^{-3}$ is over 90 cm$^2$V$^{-1}$s$^{-1}$. This decrease in mobility as the carrier concentration in the active semiconductor layer 12 is reduced to below about 7×10$^{19}$ cm$^{-3}$ is typical of barium stannate films and is a result of scattering from the huge density of threading dislocations, which become less effectively screened from the mobile charge carriers as the carrier concentration is reduced. The mobility, limited by the threading dislocations, is given by:

$$\mu_{td} = \frac{4ec^2}{Z^2 \hbar N_{td}} \left(\frac{3n}{\pi^4}\right)^{2/3} (1 + y(n))^{3/2}$$

where $$y(n) = \frac{2\pi^2 \hbar \varepsilon}{e^2 m^*}(3\pi^2 n)^{1/3}$$

and e, c, Z, N$_{td}$, n, e, and m* are the electron charge, c-axis lattice parameter, charge state of a unit cell in a threading dislocation, density of threading dislocations, carrier concentration, dielectric permittivity, and effective mass, respectively. The mobilities of this exemplary tin oxide semiconductor film 36 (e.g., with barium stannate on magnesium oxide) are the highest yet reported at the relatively low carrier concentrations and low thickness of the active semiconductor layer 12, which are needed to be able to fully deplete the channel of the semiconductor device 10 when a voltage is applied to the gate 22.

The tin oxide semiconductor film 36 (e.g., barium stannate thin film) is reactive-ion etched to pattern one or more TFTs. The etching of the tin oxide semiconductor film 36 is achieved using the controllable etching process described above, which preserves surface roughness and electrical properties including resistivity and mobility. For device isolation, the tin oxide semiconductor film 36 was etched down about 18 nm, considerably beyond the 10 nm thickness of the active semiconductor layer 12 and well into the buffer layer 44. The thickness of the dielectric layer 24 was 20 nm.

The resulting micron-scale, photolithography defined tin oxide-based (e.g., barium stannate-based) transparent TFT has a peak field-effect mobility of 17.2 cm$^2$V$^{-1}$s$^{-1}$, an on-off ratio over 1.5×10$^8$, drain current I$_D$ over 0.468 milliamps per micron (mA/μm) and a peak transconductance (g$_m$) of 28.5 millisiemens per millimeter (mS/mm). As described further below, this is one of the highest performance fully transparent oxide TFTs ever reported.

The large difference between the field-effect mobility and the Hall mobility can be attributed to the contact resistance. The contact resistance of ITO used in the source electrode 46 and the drain electrode 48 of the embodiment of FIG. 3A is 0.51 ohm-centimeters (Ω·cm). The normalized resistance of the active semiconductor layer 12 of La—BaSnO$_3$ with respect to the channel width is calculated by R$_s$×L, where R$_s$ and L are sheet resistance and channel length, respectively. A sheet resistance of 5.4 kilohms per square (kΩ/sq) was measured by a Hall measurement and the channel length is 0.3 μm, giving a channel resistance of 0.16 Ω·cm. When a drain-to-source voltage V$_{DS}$=1 volt (V) is applied, the actual voltage applied to the channel is given by $$V_{channel} = \frac{R_{channel}}{R_{ITO} + R_{channel}} V_{DS} = 0.24 \text{ V}.$$

This is only a fraction of V$_{DS}$ due to the high contact resistance of the ITO. Replacing V$_{DS}$ by V$_{channel}$ in the equation $$\mu_{FE} = \left(\frac{L}{C_{ox} W V_{DS}}\right) \frac{\partial I_{DS}}{\partial V_{GS}}$$

yields the field-effect mobility, 72 cm$^2$V$^{-1}$s$^{-1}$. This is comparable to the mobility of the as-grown channel layer (65.2 cm$^2$V$^{-1}$s$^{-1}$), which was determined by the Hall effect. From the details of this calculation it is clear that a lower resistance contact would make V$_{channel}$ closer to V$_{DS}$ and increase the field-effect mobility and thus the drain current.

Figure 4A:
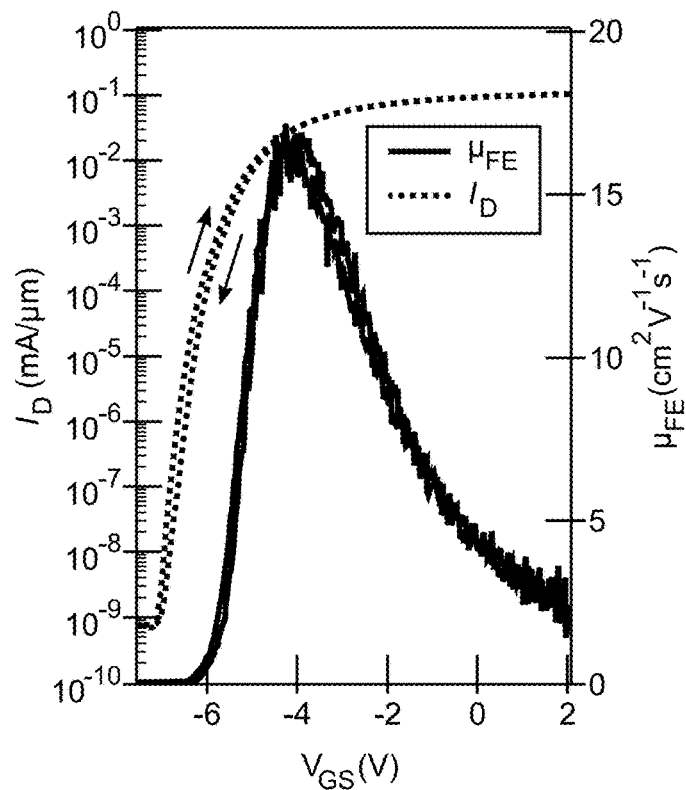
FIG. 4A is a graphical representation of a transfer characteristic of the semiconductor device of FIGS. 3A and 3B.

FIG. 4A is a graphical representation of a transfer characteristic of the semiconductor device 10 of FIGS. 3A and 3B. The drain current I$_D$ and the field-effect mobility μ$_{FE}$ are illustrated as a function of gate-to-source voltage V$_{GS}$. It can be seen that the barium stannate-based TFT described above can be depleted completely at room temperature—a first for a photolithography defined tin oxide-based TFT or barium stannate TFT. The mobility of the device is calculated from the relation $$\mu_{FE} = \left(\frac{L}{C_{ox} W V_{DS}}\right) \frac{\partial I_{DS}}{\partial V_{GS}}. \quad I_{DS}, L, C_{ox},$$

and W are drain-to-source current, the channel length, capacitance of the gate dielectric per unit area, and the channel width, respectively.

The capacitance of the gate dielectric (e.g., made with hafnium oxide) was measured with a metal-oxide-semiconductor (MOS) structure with dimensions of 50 μm×50 μm. The top and bottom electrode of the MOS were ITO and lanthanum-doped barium stannate. The capacitance decreased slightly as frequency increases from 30 kilohertz (kHz) to 100 kHz. For calculating $\mu_{FE}$, the maximum Cox at the given voltage range has been used so as to not overestimate $\mu_{FE}$. The calculated $\mu_{FE}$ is 17.2 cm$^2$V$^{-1}$s$^{-1}$. There is dispersion in the capacitance at measurement frequencies higher than 100 kHz and it is believed to be related to the trapping of charge by defects or impurities within the hafnium oxide film (e.g., the dielectric layer 24) and at the interface between the dielectric layer 24 and the active semiconductor layer 12 since the cutoff frequency is 51.6 MHz. The cutoff frequency is calculated from the relation $$f = \frac{1}{2\pi RC}$$

and is much higher than 100 kHz. The on-off ratio is over 1.5×10$^8$. This is the highest on-off ratio among barium stannate TFTs when an undoped barium stannate buffer layer 44 is used. The subthreshold swing has been calculated from the relation $$S = \left(\frac{\partial \log I_{DS}}{\partial V_{GS}}\right)^{-1}$$

and S is 0.15 volts per decade (V dec$^{-1}$).

The transconductance of the semiconductor device 10 (e.g., the TFT) at a drain-to-source voltage $V_{DS}$=1 V as a function of the gate-to-source voltage $V_{GS}$. The transconductance is calculated from the relation $$g_m = \frac{\partial I_{DS}}{\partial V_{GS}}.$$

The maximum transconductance is 28.5 mS/mm at a drain-to-source voltage $V_{DS}$=1 V. This is much higher than the previous record transconductance in a barium stannate-based TFT, which is only 2 mS/mm.

Figure 4B:
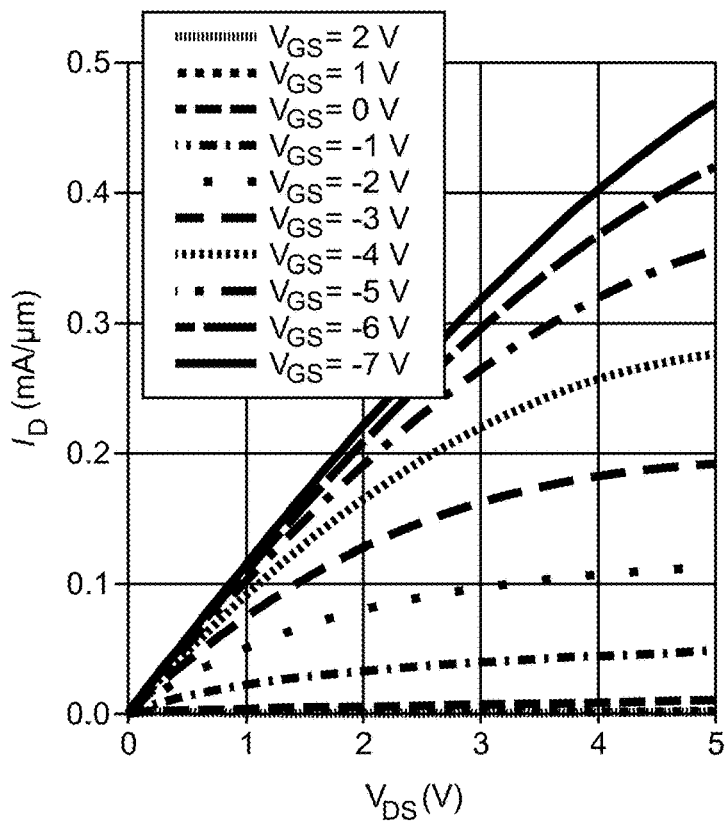
FIG. 4B is a graphical representation of an output characteristic of the semiconductor device of FIGS. 3A and 3B.

FIG. 4B is a graphical representation of an output characteristic of the semiconductor device 10 of FIGS. 3A and 3B. The output characteristic is illustrated with drain current $I_D$ as a function of drain-to-source voltage $V_{DS}$ with varying gate-to source voltages $V_{GS}$ from 2 V to −7 V. The drain current $I_D$ reaches over 0.468 mA/μm. The slow increase of the drain current $I_D$ with respect to the drain-to-source voltage $V_{DS}$ is attributed to the high contact resistance of the ITO used in the source electrode 46 and the drain electrode 48. The high contact resistance affects the slow response of the drain current $I_D$ vs. the drain-to-source voltage $V_{DS}$ in the measured output characteristics; thus, the drain current $I_D$ can be improved by lowering the contact resistance.

Figure 5:
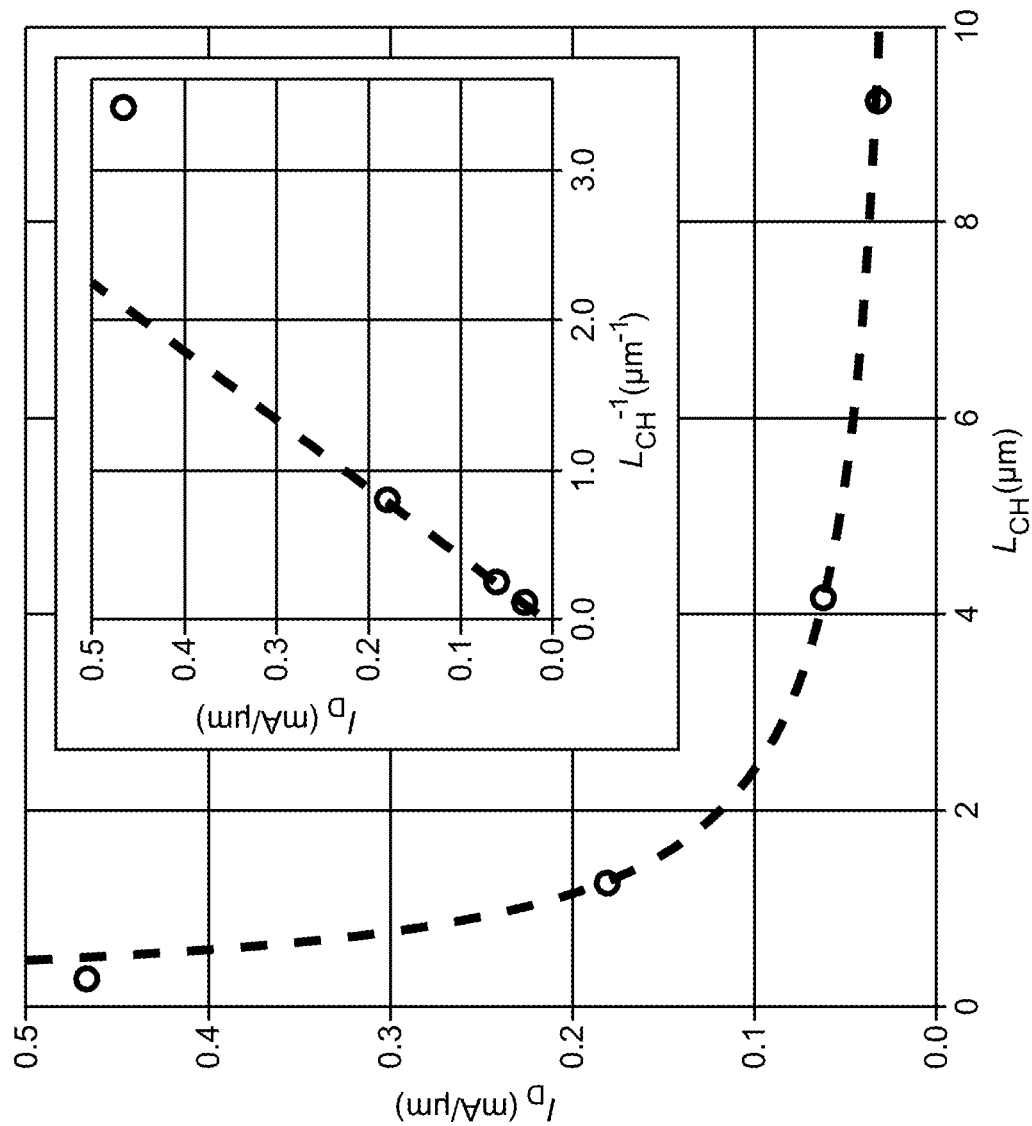
FIG. 5 is a graphical representation of drain current dependence on channel length for embodiments of the semiconductor device of FIGS. 3A and 3B.

FIG. 5 is a graphical representation of drain current dependence on channel length $L_{CH}$ for embodiments of the semiconductor device 10 of FIGS. 3A and 3B. The drain current $I_D$ is inversely proportional to the overall length $L_{CH}$ of the channel 20 except at the shortest channel length of 0.3 μm, showing little degradation with respect to device scaling. The deviation from linear behavior at the short channel length of 0.3 μm in the inset of FIG. 5 is due to contact resistance rather than short channel effects (e.g., velocity saturation).

The interface trap charge density $D_{it}$ can be calculated using:

$$S = \frac{kT\ln 10}{e}\left(1 + \frac{e^2}{C_{ox}}D_{it}\right)$$

where k, T and e are the Boltzmann constant, temperature, and electron charge, respectively. The calculated $D_{it}$ of the TFT of FIGS. 3A and 3B is 5.03×10$^{12}$ per electron volt-square centimeter (eV$^{-1}$ cm$^{-2}$).

Figure 6:
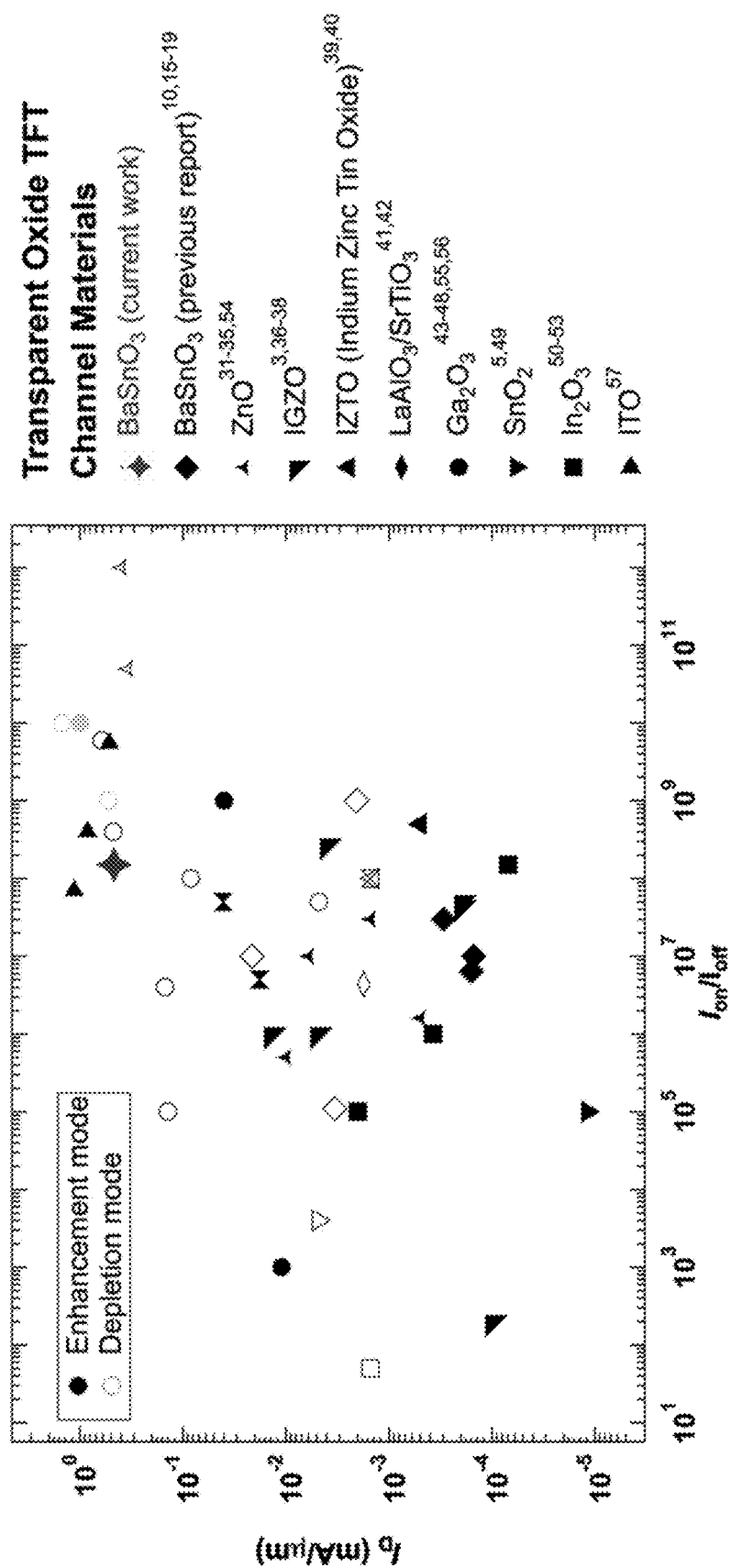
FIG. 6 is a graphical representation comparing drain current versus on-off ratio of embodiments of the semiconductor device of FIGS. 3A and 3B among transparent oxide channel TFTs.

FIG. 6 is a graphical representation comparing drain current $I_D$ versus on-off ratio ($I_{on}/I_{off}$) of embodiments of the semiconductor device 10 of FIGS. 3A and 3B among transparent oxide channel TFTs. In prior approaches, the high drain current $I_D$ of the highest performance TFT with a transparent oxide channel were achieved on cleaved and transferred flakes of beta gallium oxide (β-Ga$_2$O$_3$) onto an opaque substrate, which is not a scalable technology. These data are indicated as grey marks. Embodiments of the present disclosure with a barium stannate-based TFT exhibit among the best performances of all transparent oxide TFTs, and is comparable to the best TFTs made with transparent oxide channel materials (i.e., in device structures in which other elements are not transparent). The drain current $I_D$ of these embodiments is second best among all fully transparent scalable oxide channel TFTs.

Figure 7:
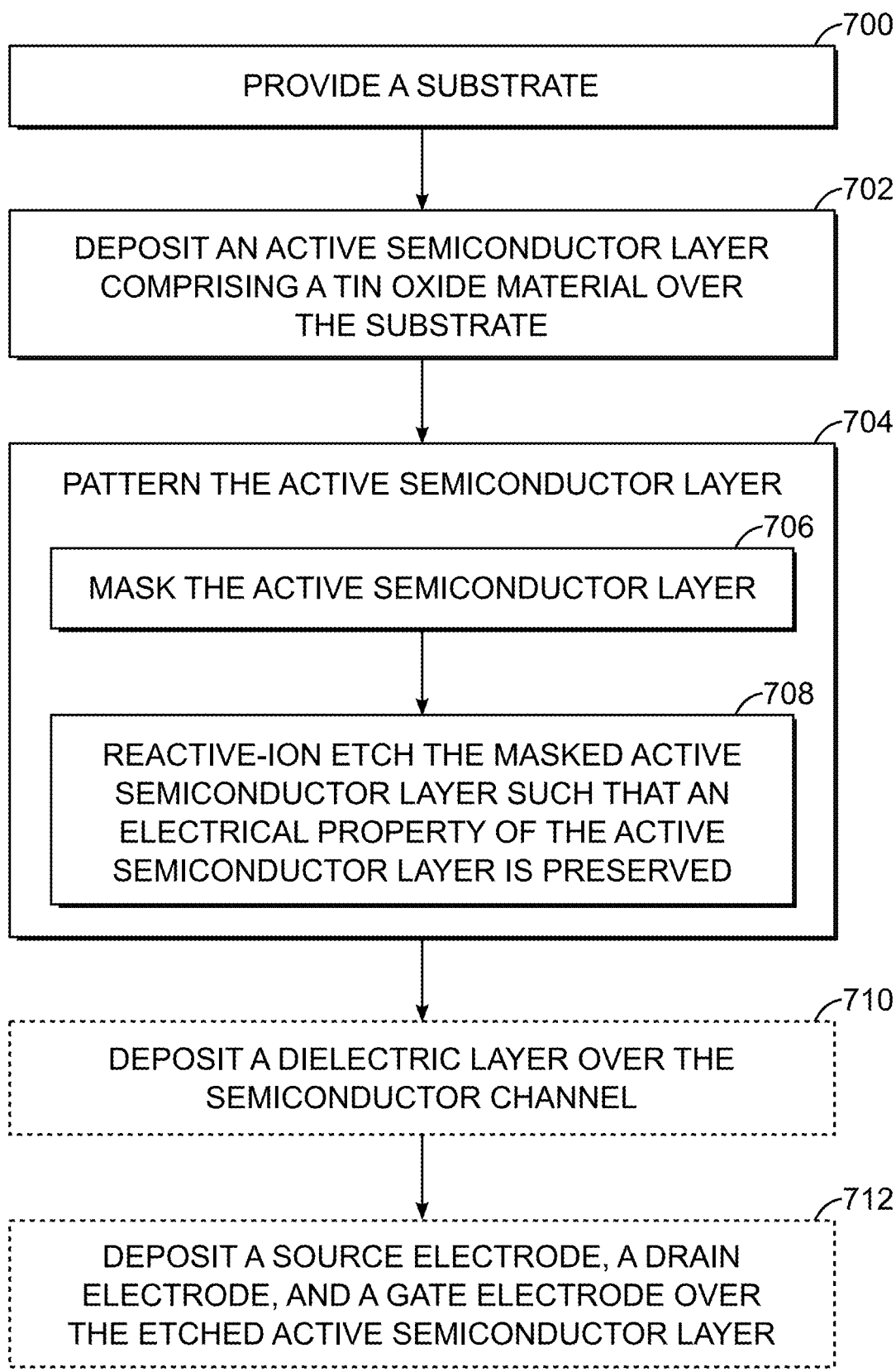
FIG. 7 is a flow diagram illustrating a process for patterning an electronic device.

FIG. 7 is a flow diagram illustrating a process for patterning an electronic device. Dashed boxes represent optional steps. The process begins at operation 700, with providing a substrate. The process continues at operation 702, with depositing an active semiconductor layer comprising a tin oxide material over the substrate. In an exemplary aspect, the active semiconductor layer is deposited in a semiconductor film (e.g., a thin film). The semiconductor film may include a doped active semiconductor layer and an undoped buffer layer between the active semiconductor layer and the substrate. In some examples, the semiconductor film is formed with barium stannate.

The process continues at operation 704, with patterning the active semiconductor layer. Operation 704 includes sub-operation 706, with masking the active semiconductor layer. In an exemplary aspect, the active semiconductor layer is masked via photolithography, such as by applying a photoresist layer defining a semiconductor channel or other features of a transistor, diode, or other semiconductor device. Operation 704 continues at sub-operation 708, with reactive-ion etching the masked active semiconductor layer such that an electrical property (e.g., resistivity and/or mobility) of the active semiconductor layer is preserved. In an exemplary aspect, the tin oxide-based active semiconductor layer is etched at a controlled rate using a reactive first gas (e.g., chlorine) and a second gas (e.g., argon).

The process may optionally continue at operation 710, with depositing a dielectric layer over the semiconductor channel. The process may optionally continue at operation 712, with depositing a source electrode, a drain electrode, and a gate electrode over the etched active semiconductor layer. In an exemplary aspect, the source electrode and the drain electrode are deposited before deposition of the dielectric layer. The gate electrode can be deposited over the dielectric layer and over the semiconductor channel.

Although the operations of FIG. 7 are illustrated in a series, this is for illustrative purposes and the operations are not necessarily order dependent. Some operations may be performed in a different order than that presented. For example, at least a portion of operation 712 (e.g., deposition of the source electrode and the drain electrode) may be performed before operation 710. Further, processes within the scope of this disclosure may include fewer or more steps than those illustrated in FIG. 7.

Figure 8:
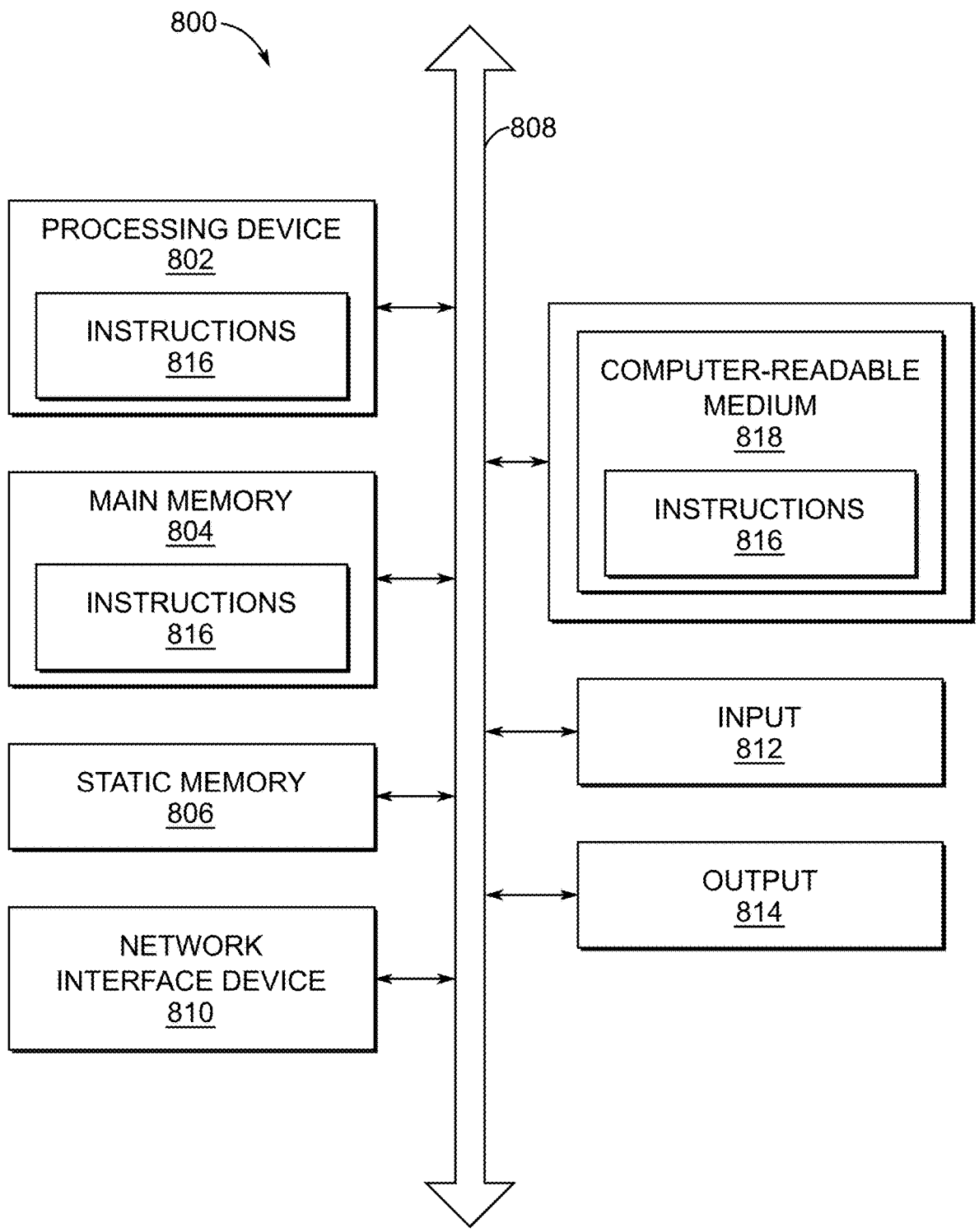
FIG. 8 is a schematic diagram of a generalized representation of an exemplary computer system that could be used to perform any of the methods or functions described above, such as patterning an active semiconductor layer.

FIG. 8 is a schematic diagram of a generalized representation of an exemplary computer system 800 that could be used to perform any of the methods or functions described above, such as patterning an active semiconductor layer. In some examples, the controller 42 of the reactive-ion etching system 26 of FIG. 1B is implemented as the computer system 800. In this regard, the computer system 800 may be a circuit or circuits included in an electronic board card, such as, a printed circuit board (PCB), a server, a personal computer, a desktop computer, a laptop computer, an array of computers, a personal digital assistant (PDA), a computing pad, a mobile device, or any other device, and may represent, for example, a server or a user's computer.

The exemplary computer system 800 in this embodiment includes a processing device 802 or processor, a main memory 804 (e.g., read-only memory (ROM), flash memory, dynamic random access memory (DRAM), such as synchronous DRAM (SDRAM), etc.), and a static memory 806 (e.g., flash memory, static random access memory (SRAM), etc.), which may communicate with each other via a data bus 808. Alternatively, the processing device 802 may be connected to the main memory 804 and/or static memory 806 directly or via some other connectivity means. In an exemplary aspect, the processing device 802 could be used to perform any of the methods or functions described above.

The processing device 802 represents one or more general-purpose processing devices, such as a microprocessor, central processing unit (CPU), or the like. More particularly, the processing device 802 may be a complex instruction set computing (CISC) microprocessor, a reduced instruction set computing (RISC) microprocessor, a very long instruction word (VLIW) microprocessor, a processor implementing other instruction sets, or other processors implementing a combination of instruction sets. The processing device 802 is configured to execute processing logic in instructions for performing the operations and steps discussed herein.

The various illustrative logical blocks, modules, and circuits described in connection with the embodiments disclosed herein may be implemented or performed with the processing device 802, which may be a microprocessor, field programmable gate array (FPGA), a digital signal processor (DSP), an application-specific integrated circuit (ASIC), or other programmable logic device, a discrete gate or transistor logic, discrete hardware components, or any combination thereof designed to perform the functions described herein. Furthermore, the processing device 802 may be a microprocessor, or may be any conventional processor, controller, microcontroller, or state machine. The processing device 802 may also be implemented as a combination of computing devices (e.g., a combination of a DSP and a microprocessor, a plurality of microprocessors, one or more microprocessors in conjunction with a DSP core, or any other such configuration).

The computer system 800 may further include a network interface device 810. The computer system 800 also may or may not include an input 812, configured to receive input and selections to be communicated to the computer system 800 when executing instructions. The input 812 may include, but not be limited to, a touch sensor (e.g., a touch display), an alphanumeric input device (e.g., a keyboard), and/or a cursor control device (e.g., a mouse). The computer system 800 also may or may not include an output 814, including but not limited to a display, a video display unit (e.g., a liquid crystal display (LCD) or a cathode ray tube (CRT)), or a printer. In some examples, some or all inputs 812 and outputs 814 may be combination input/output devices.

The computer system 800 may or may not include a data storage device that includes instructions 816 stored in a computer-readable medium 818. The instructions 816 may also reside, completely or at least partially, within the main memory 804 and/or within the processing device 802 during execution thereof by the computer system 800, the main memory 804, and the processing device 802 also constituting computer-readable medium. The instructions 816 may further be transmitted or received via the network interface device 810.

While the computer-readable medium 818 is shown in an exemplary embodiment to be a single medium, the term "computer-readable medium" should be taken to include a single medium or multiple media (e.g., a centralized or distributed database, and/or associated caches and servers) that store the one or more sets of instructions 816. The term "computer-readable medium" shall also be taken to include any medium that is capable of storing, encoding, or carrying a set of instructions for execution by the processing device 802 and that causes the processing device 802 to perform any one or more of the methodologies of the embodiments disclosed herein. The term "computer-readable medium" shall accordingly be taken to include, but not be limited to, solid-state memories, optical medium, and magnetic medium.

The operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined.

Those skilled in the art will recognize improvements and modifications to the preferred embodiments of the present disclosure. All such improvements and modifications are considered within the scope of the concepts disclosed herein and the claims that follow.

What is claimed is:

1. A method for patterning an electronic device, the method comprising:
    providing a substrate;
    depositing an active semiconductor layer comprising a tin oxide material over the substrate; and
    patterning the active semiconductor layer by:
        masking the active semiconductor layer; and
        reactive-ion etching the masked active semiconductor layer such that an electrical property of the active semiconductor layer is preserved.

2. The method of claim 1, wherein reactive-ion etching the masked active semiconductor layer comprises reactive-ion etching the masked active semiconductor layer using a first gas and a second gas.

3. The method of claim 2, wherein reactive-ion etching the masked active semiconductor layer further comprises:
    selecting an etch rate for the active semiconductor layer;
    controlling a flow ratio of the first gas to the second gas which produces the selected etch rate.

4. The method of claim 3, wherein the second gas comprises argon (Ar).

5. The method of claim 4, wherein the first gas comprises chlorine ($Cl_2$).

6. The method of claim 4, wherein the first gas comprises boron trichloride ($BCl_3$).

7. The method of claim 3, wherein:
the etch rate is a function of a characteristic relationship of the flow ratio of the first gas to the second gas; and
the characteristic relationship comprises a decreasing etch rate of the active semiconductor layer with an increasing flow ratio of the first gas to the second gas.

8. The method of claim 3, wherein the flow ratio is controlled by a controller coupled to one or more gas valves.

9. The method of claim 2, wherein the reactive-ion etching is performed in a vacuum chamber comprising an electrode, the reactive ion etching further comprising:
selecting an etch rate for the active semiconductor layer; and
controlling a power applied to the electrode to produce the selected etch rate.

10. The method of claim 9, wherein the reactive-ion etching further comprises controlling a flow ratio of the first gas to the second gas to produce the selected etch rate.

11. The method of claim 10, wherein the second gas comprises argon (Ar).

12. The method of claim 11, wherein the first gas comprises chlorine ($Cl_2$).

13. The method of claim 9, wherein the power is limited to a threshold power to maintain a resistivity of the active semiconductor layer.

14. The method of claim 13, wherein the threshold power is between 100 watts (W) and 150 W.

15. The method of claim 1, wherein the tin oxide material comprises barium stannate ($BaSnO_3$).

16. The method of claim 1, further comprising depositing a buffer layer comprising the tin oxide material over the substrate, wherein the active semiconductor layer is deposited over the buffer layer.

17. The method of claim 16, wherein the buffer layer is an undoped tin oxide layer.

18. The method of claim 1, wherein the electrical property of the active semiconductor layer is preserved within a 5% tolerance of its value before the reactive-ion etching.

19. The method of claim 18, wherein the preserved electrical property is a resistivity of the active semiconductor layer.

20. The method of claim 18, wherein the preserved electrical property is an electron mobility or a hole mobility of the active semiconductor layer.

21. The method of claim 1, wherein reactive-ion etching the masked active semiconductor layer further preserves a surface roughness of the active semiconductor layer.

22. The method of claim 1, wherein the electronic device is optically transparent.

* * * * *